(12) United States Patent
Kobayashi et al.

(10) Patent No.: US 6,850,550 B2
(45) Date of Patent: Feb. 1, 2005

(54) COMPLEX COUPLING MQW SEMICONDUCTOR LASER

(75) Inventors: Hirohiko Kobayashi, Kawasaki (JP); Tsutomu Ishikawa, Kawasaki (JP); Hajime Shoji, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 64 days.

(21) Appl. No.: 09/805,182

(22) Filed: Mar. 14, 2001

(65) Prior Publication Data

US 2002/0009116 A1 Jan. 24, 2002

(30) Foreign Application Priority Data

Mar. 17, 2000 (JP) .......................................... 2000-076908
Jan. 19, 2001 (JP) .......................................... 2001-012126

(51) Int. Cl.[7] .............................. H01S 3/08; H01S 5/00
(52) U.S. Cl. ............................... 372/96; 372/45; 372/46
(58) Field of Search .............................. 372/96, 45, 46

(56) References Cited

U.S. PATENT DOCUMENTS 5,208,824 A * 5/1993 Tsang ........................... 372/96
5,452,318 A * 9/1995 Makino et al. ................. 372/96
5,953,361 A * 9/1999 Borchert et al. ............... 372/96

OTHER PUBLICATIONS

Global and Local Effects in Gain–Coupled Multiple–Quantum–Well DFB Lasers, by A. Champagne et al., IEEE J. Quantum Electronics, vol. 35, pp. 1390–1401, 1999.

* cited by examiner

Primary Examiner—Paul Ip
Assistant Examiner—James Menefee
(74) Attorney, Agent, or Firm—Westerman, Hattori, Daniels & Adrian, LLP (57) ABSTRACT

A method of manufacturing a distributed feedback semiconductor laser, has the steps of: growing on a semiconductor substrate a lamination of alternately stacked lower barrier layer and lower well layer having a band gap narrower than the lower barrier layer, to form a lower quantum well structure; growing an intermediate layer on an uppermost lower well layer, the intermediate layer having a band gap broader than the lower well and a thickness thicker than the lower barrier layer; growing on the intermediate layer a lamination of alternately stacked upper well layer and upper barrier layer having a band gap broader than the upper well layer and a thickness thinner than the intermediate layer, to form an upper quantum well structure; forming a mask on the upper quantum well structure, the mask having periodical pattern; by using the mask as an etching mask, etching the upper quantum well structure in a periodical shape by using the intermediate layer as an etching margin layer; and removing the mask. Complex coupling DFB lasers with a small variation in characteristics can be provided.

20 Claims, 6 Drawing Sheets

COMPLEX COUPLING MQW SEMICONDUCTOR LASER

This application is based on, and claims priority on Japanese Patent Application 2000-76908 filed on Mar. 17, 2000 and Japanese Patent Application 2001-012126, filed on Jan. 19, 2001, the entire contents of which are incorporated herein by reference.

BACKGROUND OF THE INVENTION a) Field of the Invention

The present invention relates to a semiconductor laser and its manufacture method, and more particularly to a distributed feedback semiconductor laser with a built-in diffraction grating for defining an oscillation wavelength, and its manufacture method.

b) Description of the Related Art

A light source excellent in a single wavelength performance is required by an arterial optical communications system which provides long distance and high capacity transmission. Material of an optical fiber has inevitable wavelength dispersion which changes a diffractive index or light transmission speed with a wavelength. If there is wavelength dispersion in a communication wavelength band, the waveform of a light pulse is distorted as the pulse is transmitted in an optical fiber. If a single chrominance performance of a laser beam is made high, the effects of wavelength dispersion are weak so that excellent transmission characteristics can be realized.

A distributed feedback semiconductor laser (DFB laser) defines its oscillation wavelength by a diffraction grating formed in the laser structure. A DFB laser is therefore excellent in the single wavelength performance. The typical structure of a DFB laser will be described with reference to FIGS. 5A and 5B and FIGS. 6A and 6B.

Figure 5A:
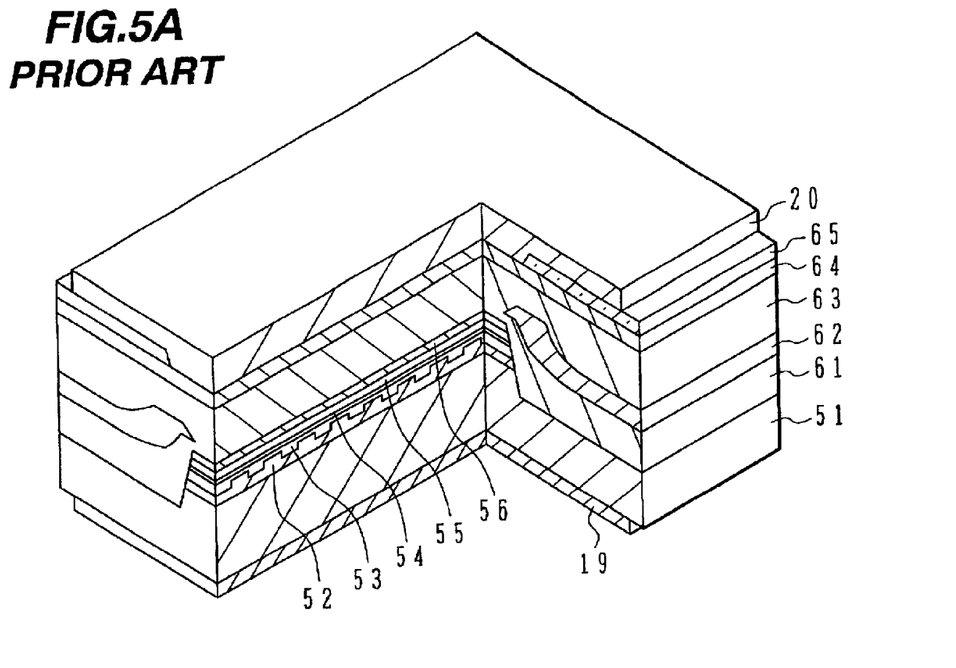
FIGS. 5A and 5B are a perspective view partially broken and a cross sectional view showing the structure of a refractive index coupling DFB laser according to conventional techniques.
Figure 5B:
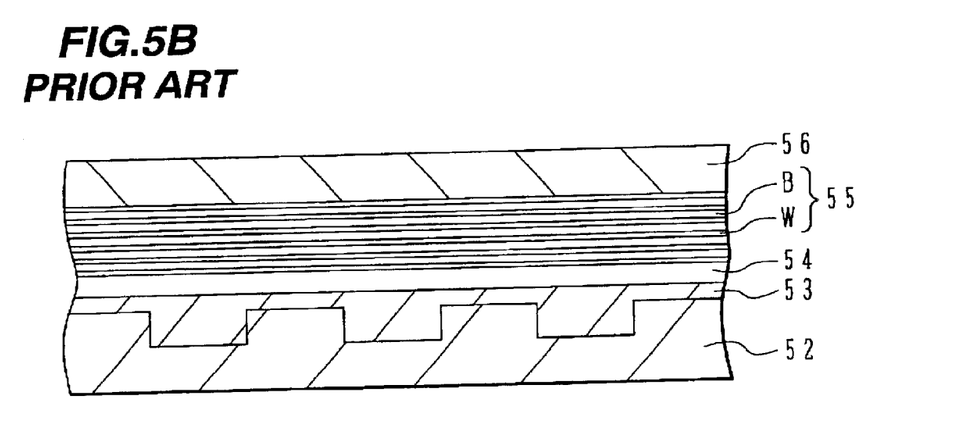

FIGS. 5A and 5B are a perspective view and a cross sectional view showing the structure of a refractive index coupling type DFB laser. On the surface of an n-type semiconductor substrate 51, an n-type clad layer 52 is formed which has a periodical step structure and a relatively low refractive index. On this n-type clad layer 52, an n-type guide layer 53 is formed which has a periodical step burying shape and a relatively high refractive index. The clad layer 52 and guide layer 53 having different refractive indices constitute a diffraction grating.

On the n-type guide layer 53, a layer 54 of a relatively low refractive index is formed. On this layer 54, a quantum well active layer 55 is formed. This active layer 55 is an alternate lamination of well layers W and barrier layers B. The well layer W has a composition for a relatively long wavelength and a relatively high refractive index. The barrier layer B has a composition for a relatively short wavelength and a relatively low refractive index. On the active layer 55, a p-type guide layer 56 is formed which has a relatively low refractive index. The lamination up to the p-type guide layer 56 has a striped mesa shape.

FIG. 5B is a cross sectional view showing the details of the structure near the n-type clad layer 52 and n-type guide layer 53. The n-type guide layer 53 has a refractive index higher than that of the n-type clad layer 52. The periodical step structure of the clad layer 52 and guide layer 53 therefore forms a periodical structure in terms of a refractive index.

The quantum well active layer 55 made of an alternate lamination of the well layers W and barrier layers B is an active layer for amplifying light. Light distributes, in the vertical direction, in the active layer 55 and also in the regions higher and lower than the active layer 55. The light components existing in the region lower than the active layer 55 are influenced by the periodical structure of the refractive index formed by the clad layer 52 and guide layer 53. Namely, the periodical structure of the guide layer 53 and clad layer 52 functions as a diffraction grating.

Reverting to FIG. 5A, a p-type burying layer 61 and an n-type burying layer 62 are formed burying the periphery of the striped mesa structure. These mesa structure and burying layers can be manufactured by forming a striped hard mask of $SiO_2$ or the like on the p-type guide layer 56, then mesa-etching the subject layers, and thereafter selectively growing the burying layers on the exposed semiconductor surface. Thereafter, the hard mask is removed.

On the p-type guide layer 56 and n-type burying layer 62, a p-type clad layer 63 and a $p^+$-type contact layer 64 are formed. Insulating layers 65 of $SiO_2$ or the like are formed on both sides of a striped region of the $p^+$-type contact layer 64. A p-side electrode 20 is formed on the contact layer 64 and insulating layers 65. In the striped region having no insulating layer 65, the p-side electrode 20 contacts the contact layer 64 to selectively inject current. The current distribution is confined also by the burying layers 61 and 62 and concentrated upon the mesa region. An n-side electrode 19 is formed on the substrate bottom surface.

This DFB laser oscillates at a wavelength near a Bragg wavelength determined by the period of the diffraction grating and has a high single chrominance performance.

A diffraction grating such as shown in FIG. 5B has thick regions and thin regions of the n-type guide layer 53. Two longitudinal modes exist depending upon which one of the thick and thin regions corresponds to the antinode of a standing wave. The DFB laser shown in FIGS. 5A and 5B does not oscillate precisely at the Bragg wavelength, but probabilistically oscillates either at a long or short wavelength side, or oscillates in the two modes at the same time.

A structure ($\lambda/4$ shift structure) has been proposed, the structure defining the oscillation mode by forming a ¼ wavelength phase shifter in the central area of a diffraction grating. In order to obtain a stable oscillation at a Bragg wavelength of a laser having this structure, it is necessary to avoid the effects of light reflected from end surfaces. If light reflected from an end face reaches the diffraction grating region, the phase of the diffraction grating is interfered with the phase of reflected light.

In order to remove reflected light, it is necessary to form a non-reflection (antireflection) film on opposite end surfaces. When the non-reflection film is formed on both end surfaces, light approximately same in amount outputs from both the end surfaces. Therefore, the light utilization factor of a light radiator utilizing light output from one end surface is approximately halved. If light returns from the external of the laser, an oscillation spectrum becomes unstable.

A gain coupling DFB laser (complex coupling DFB laser) has been proposed as a laser having a higher reliability of an oscillation spectrum than that of a refractive index coupling DFB laser.

Figure 6A:
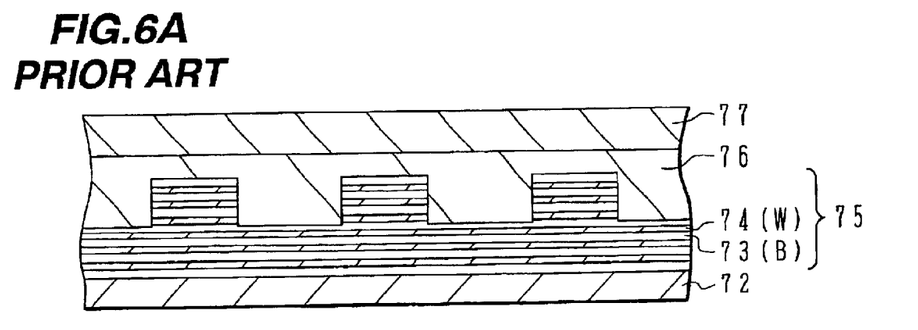
FIGS. 6A, 6B, 6C and 6D are cross sectional views illustrating a method of forming a quantum well active layer of a complex coupling DFB laser according to conventional techniques.

FIG. 6A is a schematic diagram showing the outline structure of an active layer of a gain coupling DFB laser. On an n-type clad layer 72, barrier layers (B) 73 and well layers (W) 74 are alternately laminated to form a multiple quantum well structure 75 (having the barrier layers 73 as its uppermost and lowermost layers).

The barrier layers (B) 73 and well layers (W) 74 are periodically removed from the surface of the multiple quantum well structure 75 to an intermediate depth thereof. In the structure shown in FIG. 6A, the regions to the half depth of the fourth barrier layer (B) 73 as counted from the uppermost barrier layer are removed. A p-type guide layer 76 is formed covering this periodical structure. On this p-type guide layer 76, a p-type clad layer 77 is formed.

In this gain coupling DFB laser, the multiple quantum well structure itself is periodically removed to form a diffraction grating. Carriers are injected also laterally into the well layers (W) 74 constituting the diffraction grating. Therefore, a gain of injection current periodically changes along a resonator direction and a large gain coupling coefficient can be obtained.

In the gain coupling DFB laser, the position (antinode position) of a large amplitude of a light standing wave generated along the resonator direction is fixed approximately to the position having a large gain. Therefore, the effects of external return light are rare and the oscillation spectrum is stable. The effects of the phase of light reflected at an end surface are also rare. Therefore, disturbance of an oscillation spectrum is small even for an asymmetric resonator structure having a non-reflection film formed only on a front or output end surface and a high reflection film formed on the rear end surface.

The manufacture processes for an active layer of such a gain coupling DFB laser will be described with reference to FIGS. 6B to 6D.

Figure 6B:
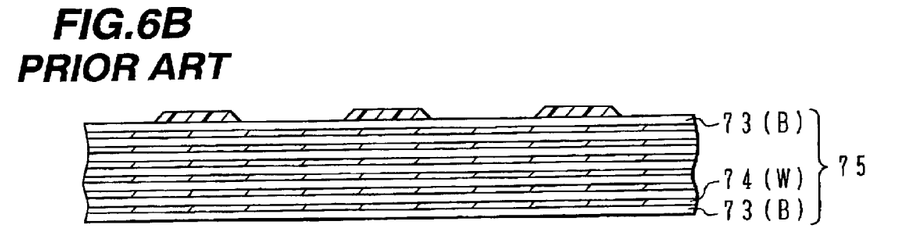

As shown in FIG. 6B, a multiple quantum well structure 75 is formed by alternately laminating barrier layers (B) 73 having a wide band gap and well layers (W) 74 having a narrow band gap. On the surface of this multiple quantum well structure 75, a resist mask 80 having a periodical structure is formed.

Figure 6C:
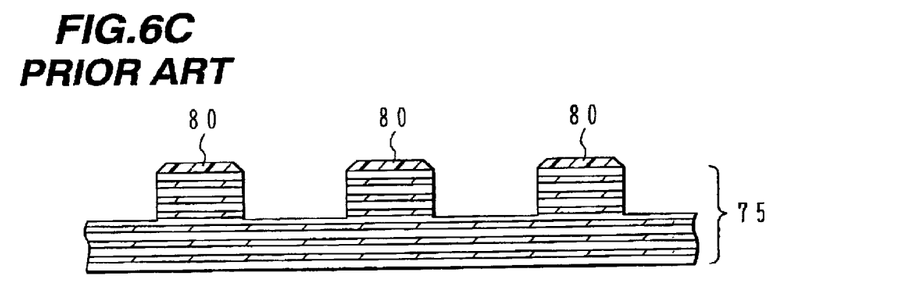

As shown in FIG. 6C, by using the resist mask 80 as an etching mask, the multiple quantum well structure 75 is etched to an intermediate depth. This etching is stopped at an intermediate depth of the fourth barrier layer (B) 73. The resist mask 80 is thereafter removed.

Figure 6D:
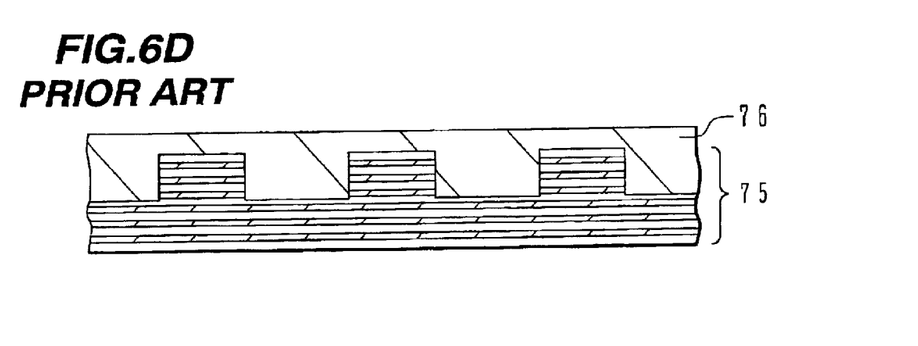

As shown in FIG. 6D, a p-type guide layer 76 is grown burying the step regions of the multiple quantum well structure 75 partially etched to have the periodical structure. Thereafter, mesa etching, burying layer forming, clad layer forming and contact layer forming are performed. In this manner, the multiple quantum well structure having the periodical structure as shown in FIG. 6A is formed.

In the gain coupling DFB laser, the active layer itself having a high refractive index is etched. Therefore, a complex coupling diffraction grating is formed which has both refractive index modulation and gain modulation at the same time along the resonator direction. Such a complex coupling DFB laser oscillates at a long wavelength side of a Bragg wavelength.

In the complex coupling DFB laser, carriers are injected also laterally into the upper well layers W in the stepped regions. Therefore, a large gain coupling coefficient can be obtained and a refractive index coupling coefficient can be set to a smaller value than that of the structure with all well layers in the active layer being etched. The above-described advantages of the complex coupling DFB laser can be utilized greatly.

For the fundamental structure and performance analysis of a gain coupling DFB laser, for example, refer to "Global and Local Effects in Gain-Coupled Multiple-Quantum-Well DFB Lasers" by A. Champagne et. al. IEEE J. Quantum Electron., vol. 35, pp. 1390–1401, 1999.

A quantum well active layer such as shown in FIG. 6A is formed, for example, by alternately laminating well layers about 5 nm in thickness and barrier layers about 10 nm in thickness. In the structure shown in FIG. 6A, etching is stopped at an intermediate depth of the fourth barrier layer as counted from the uppermost layer.

It is not easy to stop etching precisely at an intermediate depth of a barrier layer having a thickness of about 10 nm. When a variation in intra-wafer or inter-wafer etch rate distributions is taken into consideration, the number of etched well layers in the same wafer or among different wafers may change. As the number of etched well layers changes, gain coupling and refractive index coupling components change so that the characteristics of lasers change from one laser to another laser.

If the periodical structure is formed by dry etching, crystal defects may be introduced by this etching. If the etching of a barrier layer is not stopped at a desired position but the left barrier layer becomes too thin or the underlying well is exposed or even partially etched, then crystal defects are introduced into the well layer. These crystal defects increase non-radiative recombination centers.

SUMMARY OF THE INVENTION

It is an object of the present invention to provide a complex coupling DFB laser having a small variation in its characteristics.

According to one aspect of the present invention, there is provided a distributed feedback semiconductor laser, comprising: a lower quantum well structure extending along a resonator direction, the lower quantum well structure having a lamination of alternately stacked lower barrier layer and lower well layer having a band gap narrower than the lower barrier layer; an intermediate layer disposed on the lower quantum well structure, the intermediate layer having a band gap broader than the lower well layer and a thickness thicker than the lower barrier layer; and an upper quantum well structure periodically disposed on the intermediate layer along the resonator direction, the upper quantum well structure having a lamination of alternately stacked upper well layer and upper barrier layer having a band gap broader than the upper well layer.

According to another aspect of the invention, there is provided a method of manufacturing a distributed feedback semiconductor laser, comprising the steps of: (a) growing on a semiconductor substrate a lamination of alternately stacked lower barrier layer and lower well layer having a band gap narrower than the lower barrier layer, to form a lower quantum well structure; (b) growing an intermediate layer on an uppermost lower well layer, the intermediate layer having a band gap broader than the lower well layer and a thickness thicker than the lower barrier layer; (c) growing on the intermediate layer a lamination of alternately stacked upper well layer and upper barrier layer having a band gap broader than the upper well layer and a thickness thinner than the intermediate layer, to form an upper quantum well structure; (d) forming a mask on the upper quantum well structure, the mask having periodical pattern; (e) by using the mask as an etching mask, etching the upper quantum well structure in a periodical shape by using the intermediate layer as an etching margin layer; and (f) removing the mask.

The multiple quantum well structure is divided into the lower and upper quantum well structures and the intermediate layer thicker than the barrier layer is interposed between the lower and upper quantum well structures. It is therefore easy to stop etching at the intermediate layer. In this sense, the intermediate layer works as etching margin layer.

It is also easy to stop etching by leaving a sufficient distance to the active layer just under the intermediate layer. Even if etching is performed by reactive ion etching (RIE), it becomes easy to prevent crystal defects from reaching the well layer. Therefore, it becomes easy to prevent the light radiation efficiency from being lowered.

It becomes possible to obtain a complex coupling DFB laser having a small variation in its characteristics.

It becomes easy to manufacture a complex coupling DFB laser.

DETAILED DESCRIPTION OF THE PREFERRED EMBODIMENTS

Figure 1:
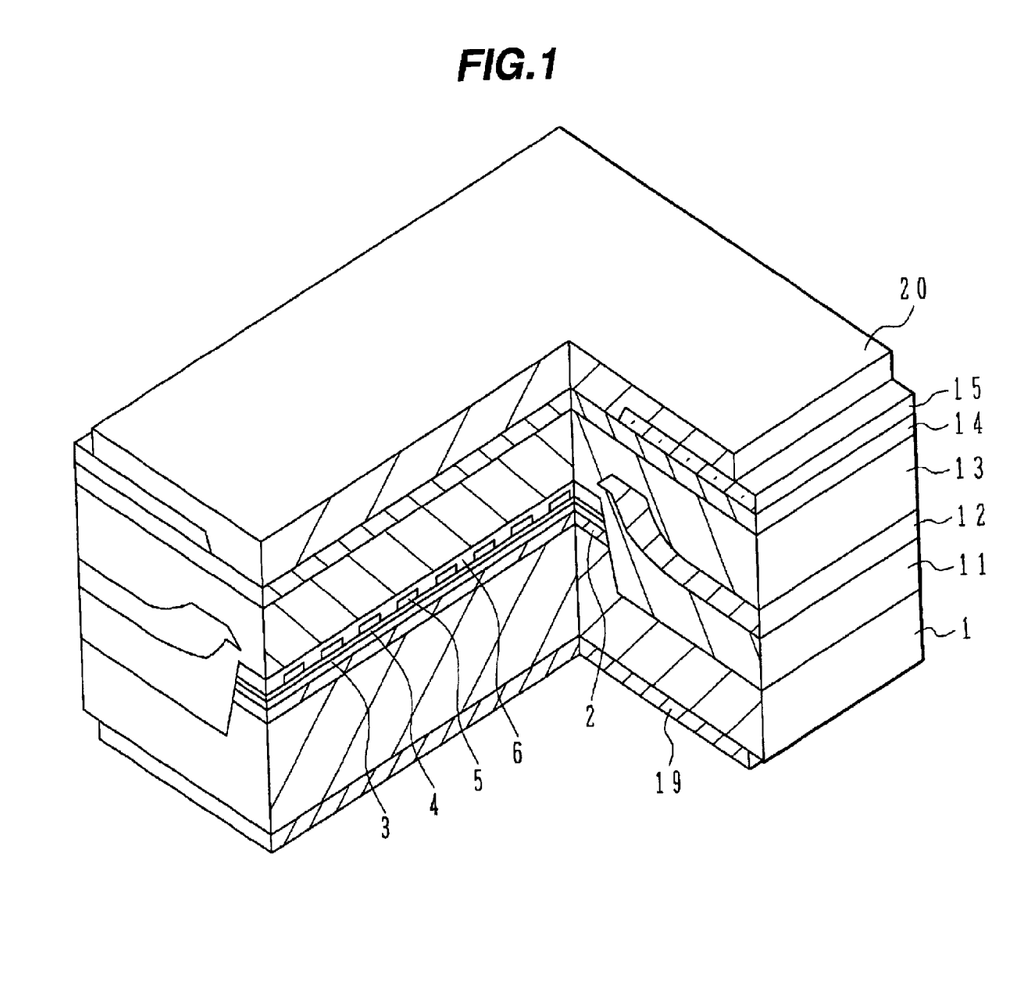
FIG. 1 is a perspective view partially broken showing the outline structure of a complex coupling DFB laser having a mesa structure according to an embodiment of the invention.

FIG. 1 is a perspective view partially broken showing a distributed feedback semiconductor layer having a mesa structure according to an embodiment of the invention. The description will be given by taking as an example a complex coupling DFB laser in the 1.5 μm band (1.55 μm band). On the surface of an n-type InP substrate 1 containing an n-type impurity Si at about $10^{18}$ cm$^{-3}$, an n-type InP buffer layer 2 doped with Si at $5 \times 10^{17}$ cm$^{-3}$ is grown to a thickness of about 0.1 μm by metal organic vapor phase epitaxy (MOVPE). Thereafter, a lower quantum well active layer 3 is grown. The n-type InP buffer layer 2 and n-type InP substrate 1 function also as an n-type clad layer.

Figure 2A:
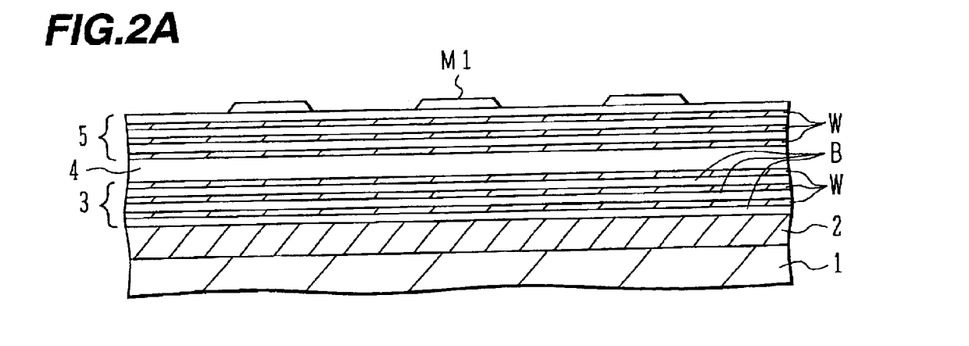
FIGS. 2A, 2B and 2C are cross sectional views illustrating a method of forming a quantum well diffraction grating according to an embodiment of the invention.

As shown in FIG. 2A, the lower quantum well active layer 3 has an alternate lamination structure of, for example, three barrier layers B and three well layers W. For example, the barrier layer B is made of an InGaAsP layer having a composition for 1.3 μm, a thickness of about 10 nm, and no strain. The well layer W is made of an InGaAsP layer having a composition for 1.55 μm, a thickness of about 5 nm and about 1% of compressive strain. A well layer without strain may be used. Parameters such as the compositions of the well and barrier layers are preferably determined in accordance with experiments such as oscillation wavelength experiments. The lower quantum well active layer comprises at least one barrier layer and at least one well layer.

On the lower quantum well active layer 3, an InGaAsP intermediate layer 4 is grown having, for example, a composition for 1.3 μm and a thickness of 100 nm. Since the intermediate layer 4 has a function of a barrier layer, the intermediate layer is required to have a composition for a shorter wavelength than the well layer W. For example, the intermediate layer 4 may be made of the same composition as that of the barrier layer of the lower and upper quantum well active layers 3 and 5. It is not necessarily required that the composition of the intermediate layer is the same as that of the barrier layer. In order to enhance the light confinement effects, the composition of the intermediate layer is desired to have the composition for as longer wavelength as possible. From these viewpoints, if the well layer has a composition for 1.55 μm, the composition of the intermediate layer is desired to be selected in a composition range from about 1.2 μm to about 1.4 μm, in accordance with the process conditions.

On the intermediate layer 4, the upper quantum well active layer 5 is formed. The upper quantum well active layer has also the alternate lamination structure of, for example, three well layers W and three barrier layers B. The upper quantum well active layer comprises at least one well layer and at least one barrier layer. For example, the compositions and thicknesses of the wall layer W and barrier layer B are the same as those of the barrier layers B and well layers W of the lower quantum well active layer. The lower quantum well active layer 3, intermediate layer 4 and upper quantum well active layer 5 may be collectively called an quantum well active layer.

As shown in FIG. 2A, after the upper quantum well active layer 5 is grown, a resist mask M1 is formed on the upper quantum well active layer 5. The resist mask M1 is formed by performing two-beam interference exposure and thereafter development. Interference between two beams forms the resist mask M1 having regular repetitive striped patterns. A pitch between stripes defines the lattice constant of a diffraction grating.

Figure 2B:
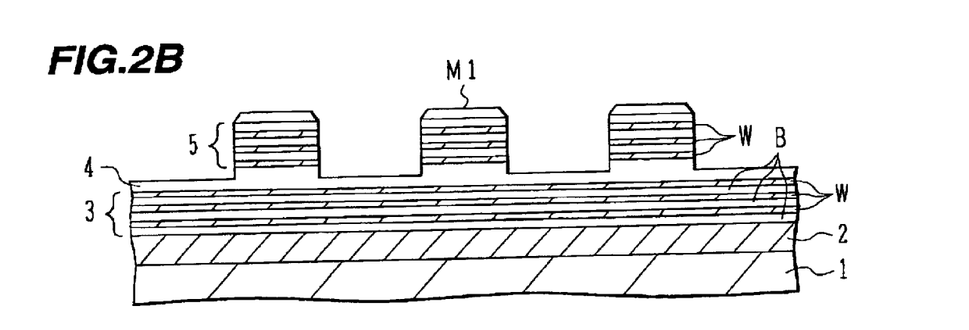

As shown in FIG. 2B, by using the resist mask M1 as an etching mask, the upper quantum well active layer 5 is anisotropically etched through reactive ion etching (RIE) using methane containing etching gas. Etching is stopped at an intermediate depth of the intermediate layer 4. If etching is to be performed to a half depth of the intermediate layer 4, this etching time is 3 minutes and 15 seconds, for example.

The intermediate layer 4 is sufficiently thicker than that of the barrier layer B so that etching can be stopped reliably at an intermediate depth of the intermediate layer which affords margin to etching. The resist mask M1 is thereafter removed. The upper quantum well active layer 5 has periodical patterns disposed at a constant lattice constant matching the mask M1 and forms a diffraction grating.

Figure 2C:
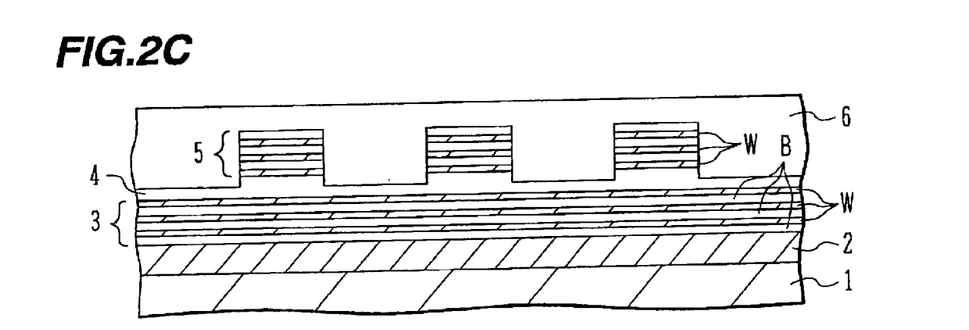

As shown in FIG. 2C, a p-type guide layer 6 is grown by MOVPE to bury the upper active layer 5 periodically etched. For example, the p-type guide layer 6 is made of an InGaAsP layer having a composition for 1.1 to 1.2 μm, an impurity (Zn) concentration of $5 \times 10^{17}$ cm$^{-3}$ and a thickness of about 100 nm over the active layer 5.

After the p-type guide layer 6 is grown, an SiO$_2$ layer is formed having a striped shape along an in-plane direction perpendicular to the diffraction grating. By using this SiO$_2$ layer as an etching mask, the MQW active layer 3, 4 and 5 is etched by RIE using methane containing etching gas to leave the MQW layer 3, 4 and 5 having a width of about 1.2 μm.

The mesa structure shown in FIG. 1 is formed in the above manner. By leaving the SiO$_2$ layer, a p-type InP burying layer 11 and an n-type InP burying layer 12 are formed by performing crystal growth twice by MOVPE to thereby form a buried hetero (BH) laser structure of a pn burying type. Thereafter SiO$_2$ mask layer is removed.

A p-type InP clad layer 13 and a p⁺-type InGaAs contact layer 14 are grown by MOVPE. On the contact layer 14, an SiO₂ layer 15 is formed having an opening corresponding to the mesa structure. A p-side electrode 20 is formed on the SiO₂ layer 15 and exposed contact layer 14. For example, the p-side electrode 20 is a three-layered lamination electrode of a Ti layer, a Pt layer and an Au layer stacked in this order from the substrate side.

An n-side electrode 19 is formed on the bottom surface of the substrate 1. For example, the n-side electrode 19 is a two-layered lamination electrode of an AuGe layer and an Au layer stacked in this order from the substrate side. Thereafter, the substrate is cleaved to form a cavity and a laser structure. A non-reflection film is coated on the output end surface of the cavity and a high reflection film is coated on the opposite end surface.

In order to confirm the effects of the embodiment, a wafer having the laser structures of the embodiment and a wafer having the laser structures with the quantum well active layer formed by the method illustrated in FIGS. 6A to 6D were prepared. The wafer of the comparison example has usual barrier layers without the intermediate layer. Each wafer has about 1000 samples of the laser structures.

The wafer of the embodiment was cleaved to check the etched depth. It was confirmed that the intermediate layer having a total thickness of 100 nm was etched to a depth of 40 to 60 nm in any area of the wafer. The threshold current and slope efficiency were measured. The measurement results are shown in Table 1.

TABLE 1

|  | Average | Standard Deviation |
|---|---|---|
| Samples of Embodiment | | |
| Threshold Current | 10 mA | 0.6 mA |
| Slope Efficiency | 0.40 mW/mA | 0.01 mW/mA |
| Samples of Comparison | | |
| Threshold Current | 10 mA | 1.2 mA |
| Slope Efficiency | 0.40 mW/mA | 0.03 mW/mA |

In the embodiment examples and the comparison examples, although the averages of the threshold current and slope efficiency are the same, the standard deviations of the comparison examples are two and three times larger than those of the embodiment examples. Namely, the semiconductor laser devices of the embodiment have uniform characteristics. The structure of the embodiment described above should not be construed as limitative. For example, the thickness of the intermediate layer 4 may be thicker or thinner than 100 nm. The intermediate layer 4 is required to be thicker than the barrier layer B.

In the above-described embodiment, the same composition is used for the intermediate layer and barrier layer. After the upper active layer is etched to form the diffraction grating, this diffraction grating is buried by the burying layer. If the diffraction grating is buried in the guide layer and the clad layer is formed on this guide layer, the guide layer is generally controlled to have a refractive index having an intermediate value between those of the barrier layer and clad layer.

From this viewpoint, it is preferable that the burying guide layer does not have a higher refractive index (lower wavelength composition) than the composition of the intermediate layer. For example, if the intermediate layer has a composition for a range from 1.2 μm to 1.4 μm, the burying guide layer is controlled to have a composition for a range from 1.1 μm to 1.3 μm. The diffraction grating may be buried directly with the clad layer without using the guide layer. In the structure shown in FIG. 1, the guide layer 6 may be made of InP same as the clad layer 13. In this case, the guide layer 6 and clad layer 13 are collectively called a clad layer. A layer (or layers) burying the diffraction grating is called a burying layer where applicable. After the intermediate layer is partially etched, the diffraction grating is buried with the burying layer. An interface is formed between the intermediate layer and burying layer. For example, the burying layer for burying the diffraction grating is made of a semiconductor layer having a lower refractive index (broader band gap) than that of the barrier layer (and intermediate layer). A diffractive index interface is formed between the intermediate layer and burying layer having different refractive indices.

As the etched depth of the intermediate layer becomes deeper, the refractive index coupling coefficient becomes larger. If there is a variation in etched depths, there is a variation in refractive index coupling coefficients. The threshold current and slope efficiency of laser devices will also vary.

In this context, the intermediate layer has a function different from the barrier layer. It is therefore preferable to independently select the compositions of the intermediate layer and barrier layer. If a refractive index of the intermediate layer is set smaller than that of the barrier layer (if the composition of the intermediate layer is set for a shorter wavelength than that of the barrier layer), it becomes easy to reduce a difference between refractive indices of the intermediate layer and burying layer, i.e., to reduce a refractive index coupling coefficient. In this case, the refractive indices satisfy the relation of barrier layer>intermediate layer>burying layer.

If the burying layer is set to have the same refractive index as that of the intermediate layer, a refractive index interface is not formed between the burying layer and intermediate layer. Even if there is a variation in etched depths, the refractive index coupling coefficient is not affected. For example, in the above-described embodiment, if the well layer has a thickness of 5 nm, no strain and a composition for 1.55 μm and the barrier layer has a thickness of 10 nm and a composition for 1.2 μm, then the intermediate layer is made of an InGaAsP layer having a thickness of 100 nm and a composition for 1.1 μm and an non-doped InGaAsP guide layer having a composition for 1.1 μm is used for burying the diffraction grating.

The refractive indices (compositions) of the barrier layer, intermediate layer and burying layer are not limited to those described above. For example, the barrier layer, intermediate layer and burying layer are all made of InGaAsP having a composition for 1.3 μm. The guide layer is not necessarily required and the clad layer may bury the diffraction grating. For example, the intermediate layer may be made of InP and an InP layer may be used for burying the diffraction grating.

Since the intermediate layer is etched and thereafter the same semiconductor as the intermediate layer is used for burying the diffraction grating, a variation in etched depths can be eliminated by the burying layer. Even if there is a variation in etched depths, the characteristics of laser devices are uniform. Approximately similar effects can be expected even if the same refractive index is not used, so long as a refractive index difference is 0.01 or smaller. The refractive indices having such a difference are called "substantially same" refractive indices.

Figure 3A:
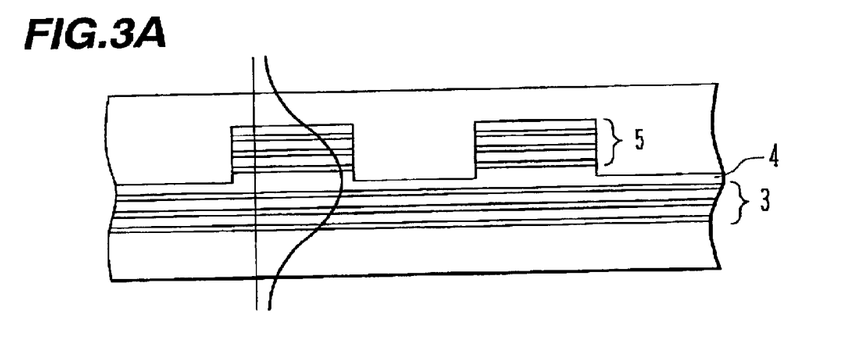
FIGS. 3A and 3B are cross sectional views explaining the effects of a thickness of an intermediate layer.
Figure 3B:
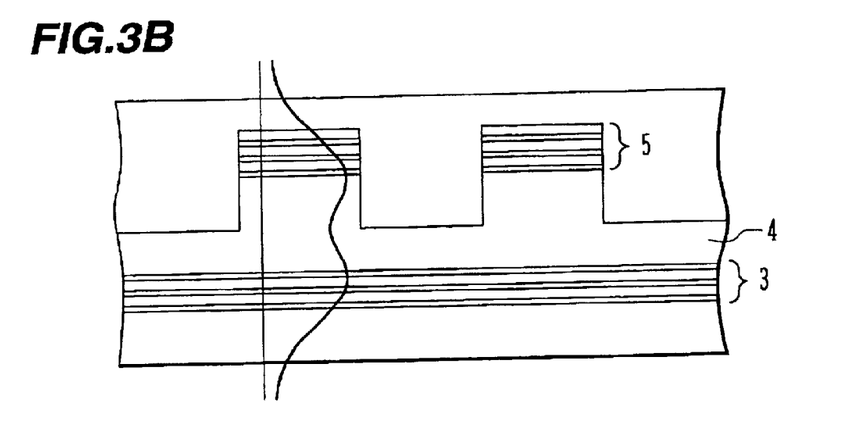

FIGS. 3A and 3B are schematic cross sectional views explaining the effects of a thickness of the intermediate layer 4. If the intermediate layer is made too thick, higher order lateral modes of light are likely to occur. As shown in FIG. 3A, if the intermediate layer 4 is thinner than a certain value, a photoelectric field distribution in the whole of the quantum well active layer takes a unimodal shape having a single peak.

As shown in FIG. 3B, if the intermediate layer 4 is made too thick, the photoelectric field distribution has a peak caused by the lower quantum well active layer 3 and a peak caused by the upper quantum well active layer 5 and takes a bimodal shape. In order to make the photoelectric field distribution maintain the unimodal distribution, it is preferable to set a thickness of the intermediate layer 4 not thicker than 300 nm.

A DFB laser having a mesa structure has been described above. DFB lasers having other structures may also be manufactured.

Figure 4:
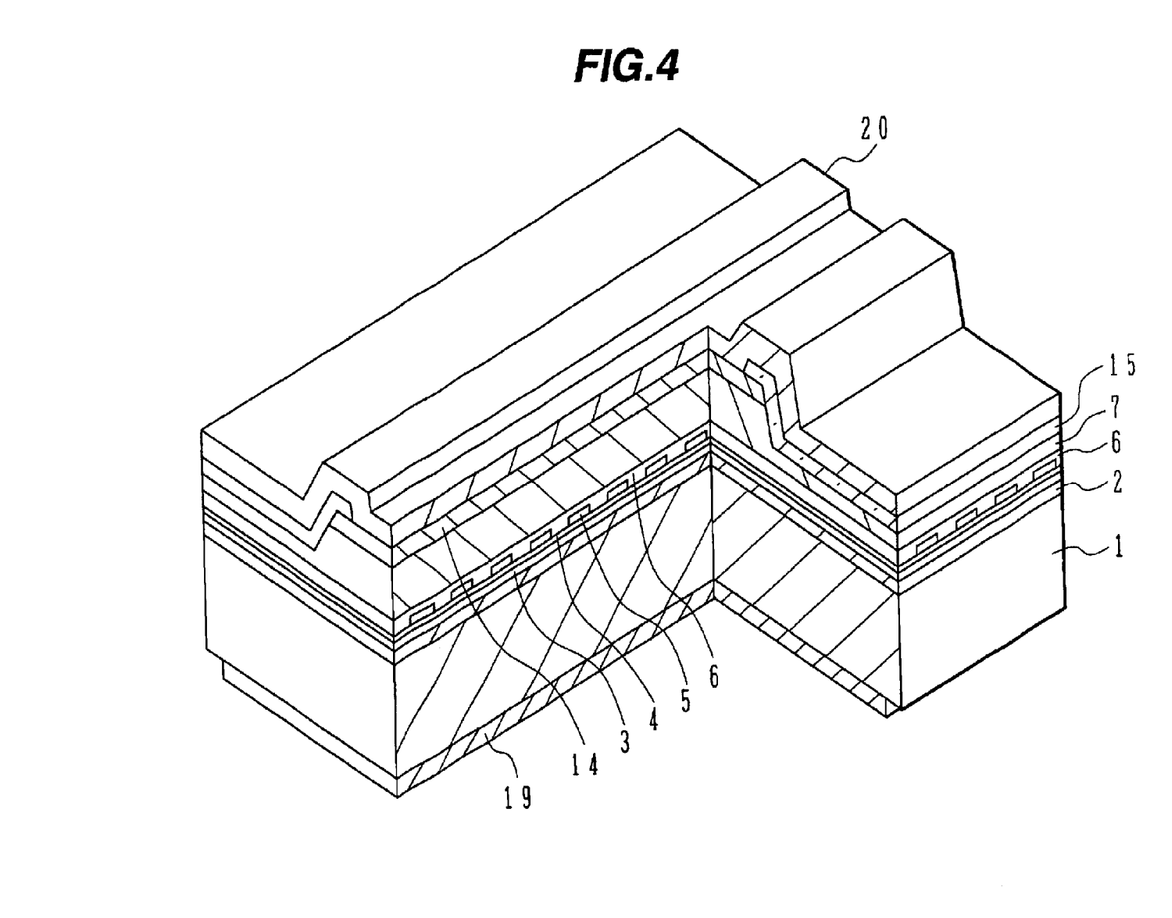
FIG. 4 is a perspective view partially broken showing the outline structure of a complex coupling DFB laser having a ridge structure according to another embodiment of the invention.

FIG. 4 shows an example of a ridge type DFB laser. After n-type InP buffer layer 2 is grown on an n-type InP substrate 1, a lower quantum well active layer 3, an intermediate layer 4 and an upper quantum well active layer 5 are grown.

A mask having periodical diffraction grating pattern is formed on the upper quantum well active layer 5. The upper quantum well active layer 5 is anisotropically etched. This etching is stopped at an intermediate depth of the intermediate layer 4. A guide layer 6 is formed burying the etched upper quantum well active layer 5. These manufacture processes are similar to those described with FIG. 1. The compositions and process conditions of the quantum well active layer are similar to the above-described embodiment.

On the guide layer 6, a p-type clad layer 7 and a p-type contact layer 14 are grown. For example, the p-side clad layer 7 is made of a p-type InP layer and the p-side contact layer 14 is made of InGaAs. After the contact layer 14 is grown, a striped mask is formed on the contact layer 14 to anisotropically etch the contact layer 14 and clad layer 7 by RIE.

In the outside area of the striped mask, the contact layer 14 is completely etched and the clad layer 7 is partially etched. Therefore, the refractive index distribution changes and the left ridge structure is given the light confinement effects.

An SiO$_2$ layer is formed having an opening corresponding to the electrode contact area on the ridge upper surface, and a p-side electrode 20 is formed. An n-side electrode 19 is formed on the bottom surface of the substrate 1. Each electrode may be made of the same material as described with FIG. 1. The wafer is cleaved to form a cavity and hence a ridge type DFB laser.

The guide layer may be omitted. The n-type substrate is used to form a laser having n-type regions in a lower area and p-type regions in a upper area. A p-type substrate may be used to form a laser having n-type regions in an upper area and p-type regions in a lower area. Although a semiconductor laser in a 1.55 μm band is manufactured in the above description, semiconductor lasers in other bands may also be made. For example, if a laser in a 1.3 μm band is to be manufactured, a substrate is made of InP, a well layer is made of InGaAsP having a composition for 1.3 μm, and a barrier layer is made of InGaAsP having a composition for 1.0 to 1.15 μm.

The present invention has been described in connection with the preferred embodiments. The invention is not limited only to the above embodiments. It will be apparent to those skilled in the art that various modifications, improvements, combinations, and the like can be made.

What we claim are:

1. A distributed feedback semiconductor laser, comprising:
    a lower quantum well structure extending along a resonator direction, said lower quantum well structure having a lamination of alternately stacked lower barrier layer and lower well layer having a band gap narrower than the lower barrier layer;
    an intermediate layer disposed on said lower quantum well structure, said intermediate layer having a band gap broader than the lower well layer and a thickness thicker than the lower barrier layer;
    an upper quantum well structure periodically disposed on said intermediate layer along the resonator direction, said upper quantum well structure having a lamination of alternately stacked upper well layer and upper barrier layer having a band gap broader than the upper well layer, and
    a diffraction-grating-burying layer disposed on said intermediate layer along the resonator direction and covering said upper quantum well structure, said diffraction-grating-burying layer having a band gap broader than the lower and upper well layers,
    wherein envelope of the upper quantum well structure is formed by etched profile which extends to and exposes said intermediate layer.

2. The distributed feedback semiconductor laser according to claim 1, wherein said intermediate layer has a surface step of a same repetition period and a same phase in repetition cycle as said upper quantum well structure.

3. The distributed feedback semiconductor laser according to claim 1, wherein said diffraction-grating-burying layer has a refractive index not higher than a refractive index of said intermediate layer.

4. The distributed feedback semiconductor laser according to claim 3, wherein said diffraction-grating-burying layer has a refractive index lower than a refractive index of said intermediate layer.

5. The distributed feedback semiconductor laser according to claim 3, wherein the refractive index of said intermediate layer is lower than a refractive index of the lower barrier layer.

6. The distributed feedback semiconductor laser according to claim 3, wherein the refractive index of said intermediate layer is substantially same as a refractive index of the lower barrier layer.

7. The distributed feedback semiconductor laser according to claim 1, wherein the refractive index of said intermediate layer has an intermediate value between a refractive index of the upper and lower barrier layers and a refractive index of said diffraction-grating-burying layer.

8. The distributed feedback semiconductor laser according to claim 7, wherein said diffraction-grating-burying layer is made of InGaAsP and the distributed feedback semiconductor laser further comprises an InP clad layer formed on said diffraction-grating-burying layer.

9. The distributed feedback semiconductor laser according to claim 1, wherein said intermediate layer has a thickness of not larger than 300 nm under said upper quantum well structure.

10. The distributed feedback semiconductor laser according to claim 1, wherein said intermediate layer and said diffraction-grating-burying layer have a substantially same refractive index.

11. The distributed feedback semiconductor laser according to claim 1, further comprising:
an InP substrate for supporting said lower quantum well structure,
wherein the lower and upper well layers are made of InGaAsP having a composition for a 1.5 μm band and the lower and upper barrier layers are made of InGaAsP having a composition for a shorter wavelength than 1.5 μm.

12. The distributed feedback semiconductor laser according to claim 11, wherein the lower and upper barrier layers are made of InGaAsP having a composition for a 1.2 μm band to a 1.4 μm band.

13. The distributed feedback semiconductor laser according to claim 11, wherein said intermediate layer is made of InGaAsP having a composition for a 1.2 μm band to a 1.4 μm band.

14. The distributed feedback semiconductor laser according to claim 11, wherein said diffraction-grating-burying layer is made of InGaAsP or InP.

15. The distributed feedback semiconductor laser according to claim 11, wherein said upper quantum well structure, said intermediate layer and said lower quantum well structure are shaped in a stripe form and the distributed feedback semiconductor laser is a mesa or ridge type laser.

16. A method of manufacturing a distributed feedback semiconductor laser according to claim 1; said method comprising the steps of:
(a) growing on a semiconductor substrate a lamination of alternately stacked lower barrier layer and lower well layer having a band gap narrower than the lower barrier layer, to form a lower quantum well structure;
(b) growing an intermediate layer on an uppermost lower well layer, the intermediate layer having a band gap broader than the lower well layer and a thickness thicker than the lower barrier layer;
(c) growing on the intermediate layer a lamination of alternately stacked upper well layer and upper barrier layer having a band gap broader than the upper well layer and a thickness thinner than the intermediate layer, to form an upper quantum well structure;
(d) forming a mask on the upper quantum well structure, the mask having periodical pattern;
(e) by using the mask as an etching mask, etching the upper quantum well structure in a periodical shape by using the intermediate layer as an etching margin layer; and
(f) removing the mask.

17. The method of manufacturing a distributed feedback semiconductor laser according to claim 16, wherein the mask having the periodical patterns is formed by performing two-beam interference exposure and development of a photoresist layer.

18. The method of manufacturing a distributed feedback semiconductor laser according to claim 16, further comprising a step of:
(g) growing a diffraction-grating-burying layer on the intermediate layer after said step (f), the diffraction-grating-burying layer covering the etched upper quantum well structure and having a band gap broader than the upper and lower well layers.

19. The method of manufacturing a distributed feedback semiconductor laser according to claim 18, further comprising a step of: (h) growing a clad layer on the diffraction-grating-burying layer after said step (g).

20. The method of manufacturing a distributed feedback semiconductor laser according to claim 18, further comprising the steps of:
(i) forming a stripe-shaped hard mask on the diffraction-grating-burying layer, the stripe-shaped hard mask extending along a direction traversing the periodical patterns;
(j) etching the diffraction-grating-burying layer, the upper quantum well structure, the intermediate layer and the lower quantum well structure, using the hard mask as an etching mask, to form a mesa structure;
(k) growing a mesa-burying-layer for burying side walls of the etched mesa structure; and
(l) removing the hard mask.

* * * * *